United States Patent
Curiel Montoya et al.

(10) Patent No.: US 9,797,423 B2
(45) Date of Patent: Oct. 24, 2017

(54) DEVICE FOR ATTACHING A SENSOR TO A LUG

(71) Applicant: SCHNEIDER ELECTRIC USA, INC., Schaumburg, IL (US)

(72) Inventors: Carlos Eutimio Curiel Montoya, Monterrey (MX); Cristina Rosas Salazar, Torreon (MX)

(73) Assignee: Schneider Electric USA, Inc., Andover, MA (US)

( * ) Notice: Subject to any disclaimer, the term of this patent is extended or adjusted under 35 U.S.C. 154(b) by 44 days.

(21) Appl. No.: 14/829,841

(22) Filed: Aug. 19, 2015

(65) Prior Publication Data

US 2017/0051848 A1   Feb. 23, 2017

(51) Int. Cl.

| F16B 2/22 | (2006.01) |
|---|---|
| F16B 2/20 | (2006.01) |
| H04Q 1/06 | (2006.01) |
| F16L 3/13 | (2006.01) |
| F16B 2/24 | (2006.01) |
| F16B 2/06 | (2006.01) |
| H02G 3/32 | (2006.01) |
| G01R 1/00 | (2006.01) |
| G01D 11/30 | (2006.01) |

(52) U.S. Cl.
CPC ............... *F16B 2/22* (2013.01); *F16B 2/06* (2013.01); *F16B 2/20* (2013.01); *F16B 2/243* (2013.01); *F16B 2/245* (2013.01); *F16L 3/13* (2013.01); *G01D 11/30* (2013.01); *G01R 1/00* (2013.01); *H02G 3/32* (2013.01); *H04Q 1/06* (2013.01)

(58) Field of Classification Search
CPC ...... F16B 2/20; F16B 2/22; F16B 2/06; F16B 2/245; F16B 2/243; H04Q 1/06; H02G 3/32; G01D 11/30; F16L 3/13
USPC ................................................ 248/74.1, 74.2
See application file for complete search history.

(56) References Cited

U.S. PATENT DOCUMENTS

| 3,020,947 A * | 2/1962 | McKelvey | F16B 37/044 411/111 |
|---|---|---|---|
| 3,216,685 A * | 11/1965 | Raymond | F16B 2/245 248/316.7 |
| 3,430,904 A * | 3/1969 | Soltysik | F16L 3/13 248/73 |
| 3,869,760 A * | 3/1975 | Meyer | F16B 2/245 24/562 |
| 4,023,758 A * | 5/1977 | Yuda | F16L 3/13 248/73 |
| 4,500,240 A * | 2/1985 | Moran | F16B 41/002 411/103 |
| 5,664,800 A * | 9/1997 | Lux | B60R 21/01 248/74.2 |
| 6,220,554 B1* | 4/2001 | Daoud | F16L 3/12 24/16 PB |

(Continued)

FOREIGN PATENT DOCUMENTS

| DE | 202010002817 U1 * | 2/2011 | ............ F16B 2/10 |
|---|---|---|---|
| EP | 1535383 | 4/2011 | |

(Continued)

*Primary Examiner* — Eret McNichols
(74) *Attorney, Agent, or Firm* — Locke Lord LLP

(57) ABSTRACT

A device for attaching a sensor to a lug has an inert resilient plastic frame which encircles the top surface of a lug and is held in place by snaps which engage the cable bore of the lug. A resilient retainer for holding a sensor extends from the frame.

11 Claims, 2 Drawing Sheets

(56) References Cited

U.S. PATENT DOCUMENTS

| | | | | |
|---|---|---|---|---|
| 6,367,744 B1* | 4/2002 | Ebersole | F16L 3/24 | 24/458 |
| 6,446,915 B1* | 9/2002 | Ismert | F16L 3/221 | 24/271 |
| 6,536,727 B1* | 3/2003 | Limber | F16B 2/22 | 248/227.1 |
| 6,612,525 B2* | 9/2003 | Bagdi | F16B 21/02 | 248/71 |
| 6,621,714 B1* | 9/2003 | Li | F16L 3/23 | 174/191 |
| 6,622,976 B1* | 9/2003 | Ianello | F16L 3/13 | 248/71 |
| 6,644,892 B2* | 11/2003 | Nishiwaki | H02G 1/088 | 174/40 CC |
| 7,219,931 B2* | 5/2007 | Kato | B60R 16/0207 | 248/60 |
| 7,304,861 B2* | 12/2007 | Takahashi | H02G 3/32 | 248/74.3 |
| 7,434,958 B2* | 10/2008 | Yang | G02F 1/133608 | 24/339 |
| 7,784,745 B2* | 8/2010 | Dodge | F16L 3/12 | 138/149 |
| 7,938,376 B2* | 5/2011 | Jimenez | B60R 11/00 | 248/229.16 |
| 8,262,035 B2* | 9/2012 | Bleus | F16L 3/1025 | 248/230.7 |
| 8,485,479 B2* | 7/2013 | Chiu | H02G 3/32 | 248/68.1 |
| 8,598,462 B2* | 12/2013 | Li | G06F 1/183 | 174/135 |
| 8,678,332 B2* | 3/2014 | Benthien | F16B 11/006 | 248/205.3 |
| 8,727,288 B2* | 5/2014 | Ruiz | H02G 3/30 | 248/65 |
| 9,266,479 B2* | 2/2016 | Mitchell | B60R 11/00 | |
| 2002/0130237 A1* | 9/2002 | Kluser | F16L 3/13 | 248/316.1 |
| 2008/0099642 A1* | 5/2008 | Schoonover | B62J 9/003 | 248/230.1 |
| 2008/0103637 A1* | 5/2008 | Bliven | F16B 2/20 | 701/1 |
| 2008/0135703 A1* | 6/2008 | Craig | A47B 96/061 | 248/229.16 |
| 2010/0116947 A1* | 5/2010 | Winkler | F16L 3/06 | 248/73 |
| 2012/0145837 A1* | 6/2012 | Li | H02G 3/32 | 248/74.2 |
| 2015/0312452 A1* | 10/2015 | Hubert | F16B 2/20 | 29/525.08 |
| 2016/0281867 A1* | 9/2016 | Hiramoto | F16B 2/20 | |
| 2016/0312949 A1* | 10/2016 | Chi Man | F16M 13/022 | |

FOREIGN PATENT DOCUMENTS

| | | | | |
|---|---|---|---|---|
| EP | 2447546 B1 | * | 11/2016 | F15B 15/2892 |
| JP | 2017009030 A | * | 1/2017 | |

* cited by examiner

DEVICE FOR ATTACHING A SENSOR TO A LUG

FIELD OF THE INVENTION

The present invention relates to apparatus for holding sensors on electrical equipment.

BACKGROUND OF THE INVENTION

Within an electrical enclosure many users want to monitor the distribution and control devices and the energy flowing therethrough by measuring variables such as temperature, humidity, current, arc emissions, or electric field strength by using a variety of sensors. Quite often these sensors will have some cylindrical form to their body or be attached to cylindrical communication lines and/or power cables. The placement of the sensors can be problematic because current enclosed electrical equipment does not usually have means to conveniently hold the sensors which monitor these variables. The sensors are thus often attached ad hoc, e.g., by using plastic ties holding the cable coming out of the sensor. This may complicate installation and operation of the sensors and may leave the sensors hanging loose and possibly interfering with the optimal operation or performance of the equipment.

SUMMARY OF THE DISCLOSED EMBODIMENTS

The present invention may provide a simple sensor attachment device composed of inert and resilient materials which is effective, reusable, and economical.

The present invention provides a sensor attachment device which takes advantage of the lugs already installed in the electrical enclosure and uses the lug as an anchor to position the sensors at desired points of the electrical equipment, for example the electromechanical connections between conductors which the lugs themselves provide. As known in the art, such lugs are provided with wire binding screws and accompanying bores, and a cable bore for containing a wire-type conductor to be held by the binding screw. In some aspects, the present invention presents a simple resilient plastic frame that snaps onto the lugs without tools and has a retainer section that holds cables, sensors, or both.

According to various aspects of the present invention a device for attaching a sensor to a lug is provided, with the device having a frame of at least three sides if open or preferably a four-sided closed frame, lying substantially in an X-Y plane and sized to fit snugly over a binding screw face of the lug; and having a retainer with resilient arms providing a structure for retaining some portion of the sensor; the retainer extending from one of the frame sides towards the outside of the frame; and a mounting snap, the snap extending in a Z axis perpendicular to the frame sides with a leg portion for resting adjacent a cable-bore face of the lug and a boss portion extending from the leg portion so as to engage an interior wall of a cable bore of the lug.

Thus, in certain aspects, the present invention may be snapped on and off the lugs and needs no installation tools. Further, when using the present invention, the electrical enclosures themselves should not need any modification, thus making the invention ideal for the retrofit placement of additional sensors. A sensor attachment device according to the present invention can be a non-intrusive, inert device that allows the binding screw and the cable to operate normally in the lug without any interference to the mechanical and/or electrical performance of the electrical equipment.

BRIEF DESCRIPTION OF THE DRAWINGS

The foregoing and other advantages of the disclosed embodiments will become apparent upon reading the following detailed description and upon reference to the exemplary drawings according to one or more embodiments disclosed herein, wherein.

DETAILED DESCRIPTION OF THE DISCLOSED EMBODIMENTS

As an initial matter, it will be appreciated that the development of an actual, real commercial application incorporating aspects of the disclosed embodiments will require many implementation specific decisions to achieve the developer's ultimate goal for the commercial embodiment. Such implementation specific decisions may include, and likely are not limited to, compliance with system related, business related, government related and other constraints, which may vary by specific implementation, location and from time to time. While a developer's efforts might be complex and time consuming in an absolute sense, such efforts would nevertheless be a routine undertaking for those of skill in this art having the benefit of this disclosure.

It should also be understood that the embodiments disclosed and taught herein are susceptible to numerous and various modifications and alternative forms. Thus, the use of a singular term, such as, but not limited to, "a" and the like, is not intended as limiting of the number of items. Similarly, any relational terms, such as, but not limited to, "top," "bottom," "left," "right," "upper," "lower," "down," "up," "side," and the like, used in the written description are for clarity in specific reference to the drawings and are not intended to limit the scope of the invention.

Figure 3:
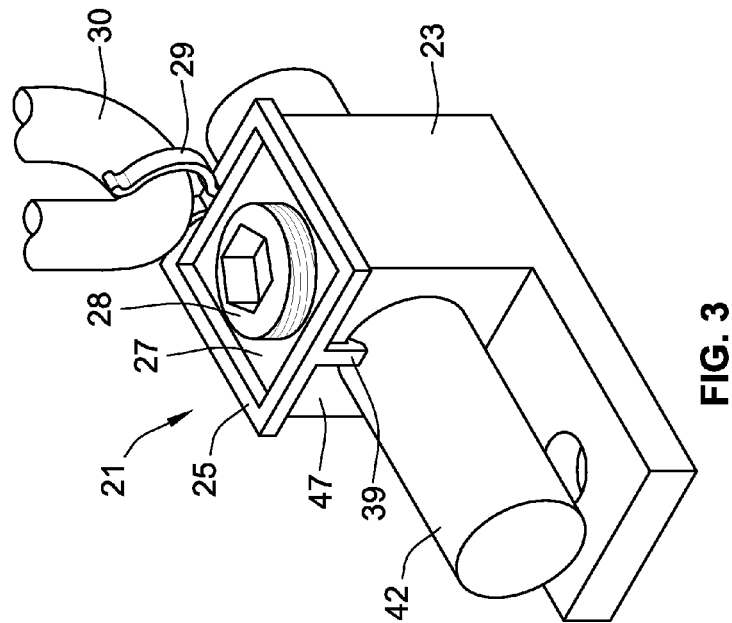
FIG. 3 is a top perspective view of an exemplary sensor attachment device holding a portion of a sensing device and secured in place on a lug retaining an electrical cable.
Figure 1:
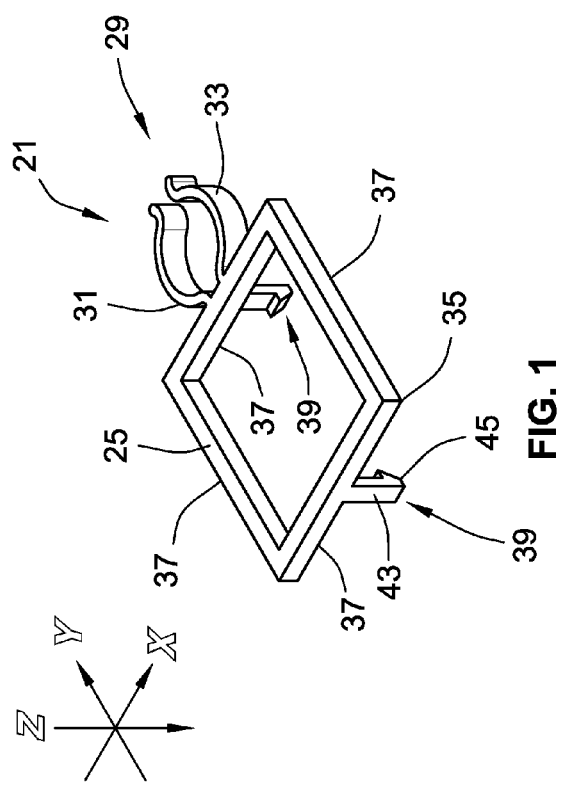
FIG. 1 is a top perspective view of an exemplary sensor attachment device according to the present invention.
Figure 2:
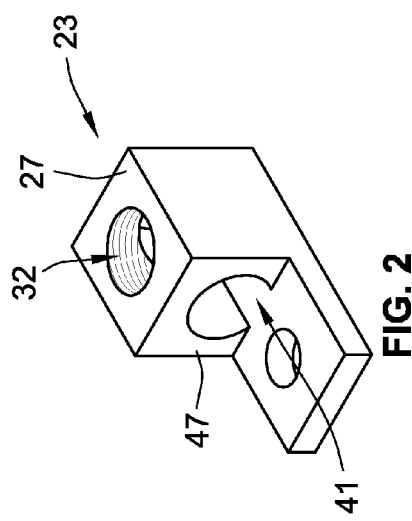
FIG. 2 is a top perspective view of a known lug suitable for use with the exemplary sensor attachment device shown in FIG. 1.

Referring particularly to FIGS. 1-3, a device 21 (FIG. 1) is shown for attaching a sensor to a lug 23 (FIG. 2). The device 21 comprises a frame 25 preferably composed of an inert nonconductive resilient plastic, here being a closed frame of four sides, although a greater or lesser number of sides might be utilized, e.g. an open frame of at least 3 sides could possibly be substituted for the one shown or other shapes fitting specialty lugs might be envisioned. The frame 25 generally defines an X-Y plane and is sized to fit snugly over the binding screw face 27 of the lug 23 and not interfere with the binding screw 28 used to secure an electrical conductor cable 42 (FIG. 3) to the lug 23. Each side 37 of the frame 25 in the illustrated aspect preferably has an L-shape cross section for engaging perpendicular faces of the lug body for added stability.

The device 21 further includes a retainer 29 with resilient arms 31, 33 providing a structure for retaining some portion of a sensing device 30 (FIG. 3), including a sensor body itself or a communications or power cable attached thereto. The arms 31, 33 might be any shape but here are shown as bow-shaped arms with a gap therebetween for the insertion and retention of a sensing device. The retainer 29 may extend in any of various orientations, compare FIGS. 1 and 3, and from one, or more if mounted at a corner 35, of the frame sides, collectively 37, and towards the outside or exterior of the frame 25.

The device 21 further includes one or more mounting snaps 39, preferably of resilient material and integrally formed with the frame 25, to removably secure the frame 25 onto the lug 23 by engaging an interior wall of a cable bore 41 of the lug 23. The snap 39 extends in a Z axis perpendicular from the frame 25. The snap 39 includes a leg portion 43 and a boss 45 forming a hook wherein the leg portion 43 will rest adjacent a cable-bore face 47 of the lug 23 and the boss portion 45 will extend from the leg portion for engaging the interior wall of the cable bore. Preferably the frame 25 will be provided with two snaps as shown in FIG. 1, for engaging opposite sides of the lug.

Figure 4:
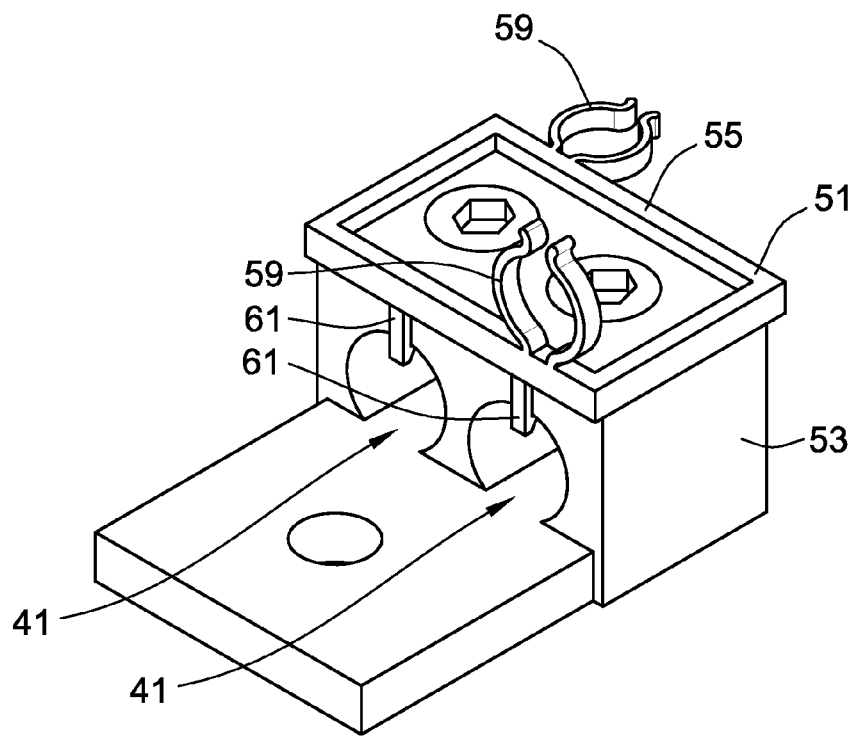
FIG. 4 is a top perspective view of an exemplary sensor attachment device for a two hole lug and having retainers in different orientations from one another.

Referencing FIG. 4, a device 51 in another aspect of the present invention has been adapted to fit a two hole lug 53. In the illustrated embodiment the frame 55 has two retainers 57, 59 thereon on different sides and extending in different orientations. Snaps 61 are preferably provided on each appropriate frame sides of the device 51 to engage the multiple cable bores, collectively 41, at the respective face of the lug 53.

Figure 5:
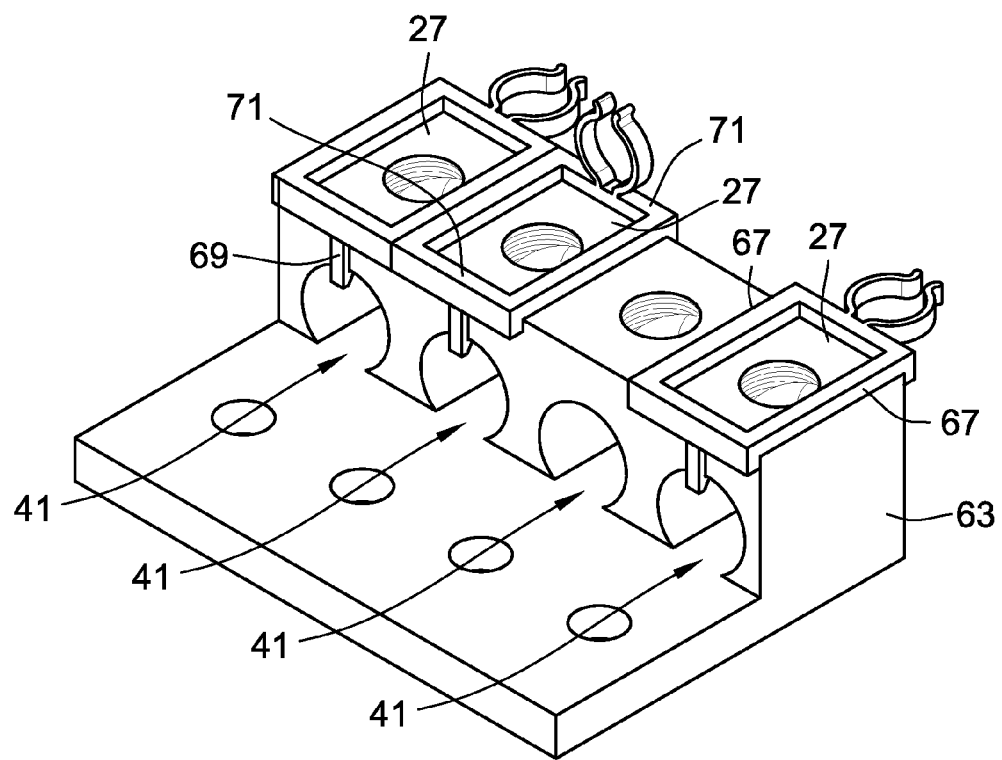
FIG. 5 is a top perspective view of multiple exemplary sensor attachment devices arranged to be placed together on the binding screw face of a multiple hole lug.

Referencing FIG. 5, a lug 63 with four side-by-side cable bores, collectively 41, has sensor holding devices 65 designed to be placed individually over the side-by-side binding screw faces collectively 27. In this aspect of the present invention it can be seen that the frame sides collectively 67, which do not carry snaps 69 have a flat cross sectional profile to rest flatly on the binding screw faces 27 rather than having an L-shaped profile like the frame sides 71 which do carry snaps 69.

While particular aspects, implementations, and applications of the present disclosure have been illustrated and described, it is to be understood that the present disclosure is not limited to the precise construction and compositions disclosed herein and that various modifications, changes, and variations may be apparent from the foregoing descriptions without departing from the scope of the disclosed embodiments as defined in the appended claims.

What is claimed is:

1. A device for attaching a sensor to a lug comprising:
   a) a lug installed as an electromechanical connection between conductors of a piece of electrical equipment, the lug having a wire binding screw and an accompanying bore and a cable bore for containing a wire-type conductor to be held by the binding screw;
   b) a frame lying substantially in an X-Y plane and sized to fit snugly over a binding screw face of the lug;
   c) a retainer with resilient arms providing a structure for retaining some portion of a sensor; the retainer extending from the frame towards the outside of the frame; and
   d) a mounting snap, the snap extending in the Z axis perpendicular to the frame so as to engage an interior wall of a cable bore of the lug; and
   e) a sensor attached within the resilient arms of the retainer.

2. A device for attaching a sensor to a lug comprising:
   a) a lug installed as an electromechanical connection between conductors of a piece of electrical equipment, the lug having a wire binding screw and an accompanying bore and a cable bore for containing a wire-type conductor to be held by the binding screw;
   b) a frame of at least 3 sides lying generally in an X-Y plane and sized to fit snugly over a binding screw face of the lug;
   c) a retainer with resilient arms providing a structure for retaining some portion of a sensing device; the retainer extending from one of the frame sides towards the outside of the frame; and
   d) a mounting snap, the snap extending in the Z axis from the frame to removably secure the frame onto the lug by engaging an interior wall of a cable bore of the lug; and
   e) a sensor attached within the resilient arms of the retainer.

3. The device for attaching a sensor according to claim 2, wherein the frame sides are composed of resilient material.

4. The device for attaching a sensor according to claim 2, wherein the retainer is composed of resilient material.

5. The device for attaching a sensor according to claim 2, wherein the snaps are composed of resilient material.

6. The device for attaching a sensor according to claim 2, further comprising opposing snaps extending from each of two opposite sides of the frame.

7. The device for attaching a sensor according to claim 6, wherein the mounting snaps include a leg portion for resting adjacent a cable-bore face of the lug and a boss portion extending from the leg portion for engaging the interior wall of the cable bore.

8. The device for attaching a sensor according to claim 2, wherein the device includes a plurality of retainers.

9. The device for attaching a sensor according to claim 8, wherein the retainers are in a plurality of orientations with respect to the sides of the frame.

10. The device for attaching a sensor according to claim 2, wherein the frame is a closed four-sided frame.

11. The device for attaching a sensor according to claim 2, further comprising at least one side of the frame having a L-shaped cross section for engaging perpendicular faces of the lug body.

* * * * *